United States Patent
Bahukhandi et al.

(10) Patent No.: US 8,581,761 B1
(45) Date of Patent: Nov. 12, 2013

(54) METHODS AND APPARATUS FOR PERFORMING CODE CORRECTION FOR HYBRID ANALOG-TO-DIGITAL CONVERTERS IN IMAGING DEVICES

(71) Applicants: Ashirwad Bahukhandi, San Jose, CA (US); Taehee Cho, Palo Alto, CA (US); Ju-Hyung Kim, Singal-dong (KR)

(72) Inventors: Ashirwad Bahukhandi, San Jose, CA (US); Taehee Cho, Palo Alto, CA (US); Ju-Hyung Kim, Singal-dong (KR)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 13/650,434

(22) Filed: Oct. 12, 2012

(51) Int. Cl.
*H03M 1/06* (2006.01)

(52) U.S. Cl.
USPC .......................................... 341/118; 341/155

(58) Field of Classification Search
USPC ......... 341/118, 120, 139, 144, 155, 161, 163, 341/156
See application file for complete search history.

(56) References Cited

U.S. PATENT DOCUMENTS

| | | | |
|---|---|---|---|
| 5,422,601 A | 6/1995 | Kovacs et al. | |
| 6,741,283 B1 * | 5/2004 | Merrill et al. | 348/308 |
| 6,965,332 B2 | 11/2005 | Nakamura et al. | |
| 7,205,921 B1 | 4/2007 | Savla | |
| 7,379,011 B2 * | 5/2008 | Ham et al. | 341/170 |
| 7,504,977 B2 | 3/2009 | Doorenbos et al. | |
| 7,733,261 B2 | 6/2010 | Bhakta et al. | |
| 8,441,387 B2 * | 5/2013 | Wang | 341/169 |
| 2013/0207825 A1 * | 8/2013 | Yamazaki | 341/156 |

* cited by examiner

*Primary Examiner* — Peguy Jean Pierre
(74) *Attorney, Agent, or Firm* — Treyz Law Group; Michael H. Lyons (57) ABSTRACT

Electronic devices may include image sensors having image sensor pixels. The pixels may be coupled to analog to digital converter (ADC) circuitry. The ADC may include a hybrid successive approximation register (SAR) ADC and ramp-compare ADC. The ramp-compare ADC may be controlled by count bits. The hybrid ADC may be subject to non-idealities at the transition between data conversion using the SAR ADC and the ramp-compare ADC. A voltage offset may be injected to the ramp-compare ADC to compensate for voltage glitches. The ramp-compare ADC may have an output range that is insufficiently matched to a least significant bit of the SAR ADC. An error correction bit may be added to the count bits to increase the output range of the ramp-compare ADC to match the SAR least significant bit. The ramp-compare ADC may include gain control circuitry to further match the output range to the SAR least significant bit.

20 Claims, 11 Drawing Sheets

METHODS AND APPARATUS FOR PERFORMING CODE CORRECTION FOR HYBRID ANALOG-TO-DIGITAL CONVERTERS IN IMAGING DEVICES

This application claims the benefit of provisional patent application No. 61/547,575 filed Oct. 14, 2011, which is hereby incorporated by reference herein in its entirety.

BACKGROUND

This invention relates generally to imaging devices, and more particularly, to imaging devices with data converting circuits and associated code correction circuitry.

Image sensors are commonly used in electronic devices such as cellular telephones, cameras, and computers to capture images. In a typical arrangement, an electronic device with an image sensor is provided with an array of image sensor pixels arranged in pixel rows and columns.

One type of conventional image sensor features analog-to-digital converter (ADC) circuitry that is connected to each column in an image pixel array. The ADC circuitry receives signals provided from image sensor pixels in a selected row via column lines. The ADC circuitry can be implemented using a hybrid ramp and successive approximation register (SAR) ADC architecture. In such types of hybrid ramp-SAR ADC architecture, a SAR ADC and a ramp ADC are sequentially used to convert analog signals to digital signals. Performing conversion in this way may sometimes exhibit non-ideal behavior due to ADC non-linearity and code mismatch at the transition between SAR conversion and ramp conversion, which can result in degraded ADC performance.

It would therefore be desirable to be able to provide imaging devices that includes hybrid ADC architectures with improved performance.

DETAILED DESCRIPTION

Electronic devices such as digital cameras, computers, cellular telephones, and other electronic devices include image sensors that gather incoming light to capture an image. The image sensors may include arrays of image sensor pixels (sometimes referred to as image pixels). The image pixels may include photosensitive elements such as photodiodes that convert the incoming light into image signals. Image sensors may have any number of image pixels (e.g. hundreds or thousands or more). A typical image sensor may, for example, have hundreds of thousands or millions of image pixels (e.g., megapixels). Image sensors may include control circuitry, such as circuitry for operating the image pixels, and readout circuitry for reading out image signals corresponding to the electric charge collected using the photosensitive elements. Readout circuitry may include selectable readout circuitry coupled to each column of image pixels. Selectable readout circuitry may include analog-to-digital converters (ADCs) for converting image pixel signals into digital signals.

Figure 1:
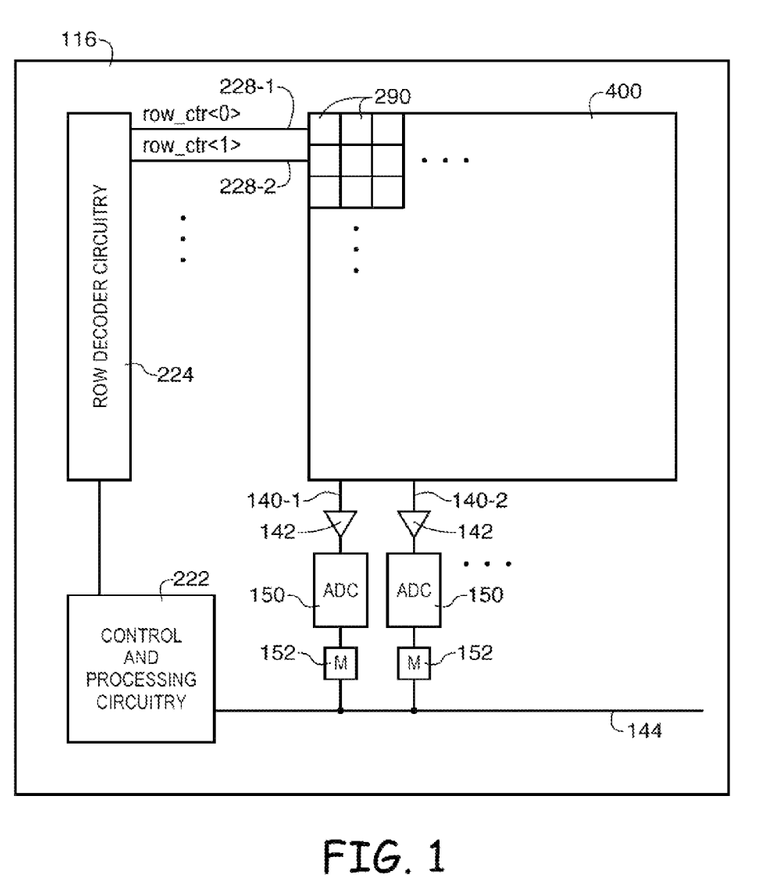
FIG. 1 is a diagram of an illustrative image sensor having an image pixel array and associated analog-to-digital converter (ADC) circuitry in accordance with an embodiment of the present invention.

FIG. 1 is a diagram of an electronic device with an image sensor that implements ADC circuitry coupled to each pixel column of an image pixel, in accordance with an embodiment of the invention. Image sensor 116 may include image sensor pixel array 400 containing image sensor pixels 290 and control and processing circuitry 222. Control circuitry 222 may be coupled to row decoder circuitry 224 and global data path 144. Row decoder circuitry 224 may receive row addresses from control circuitry 222 and supply corresponding row control signals row_ctr such as pixel reset signals, pixel row-select signals, charge storage gate transfer signals, and other row control signals to image pixels 290 over control paths 228. Image pixels 290 in each column of image pixel array 400 may be coupled to a corresponding column line 140 (e.g., image pixels 290 in a first column may be connected to column readout line 140-1, image pixels 290 in a second column may be connected to column line 140-2, etc.). Column lines 140 may be used for reading out image signals from image pixels 290 and for supplying bias signals (e.g. bias currents or bias voltages) to image pixels 290. During image pixel readout operations, a pixel row in array 400 may be selected using row decoder circuitry 224 and image data associated with image pixels 290 in that pixel row can be read out along column lines 140. Each column line 140 may include column circuitry such as column amplifiers 142, ADC circuitry 150, and memory circuit 152.

ADC circuitry 150 may be implemented using a successive approximation register (SAR) ADC architecture, ramp-compare ADC architecture (sometimes referred to as a ramp ADC), a hybrid of these architectures, or other data conversion architectures. When ADC circuitry 150 is formed using a hybrid SAR-ramp ADC architecture, ADC circuitry 150 may first perform data conversion on the image signals received from column lines 140 using a SAR ADC and subsequently perform data conversion using a separate ramp ADC. In this way, both the SAR ADC and the ramp ADC may be used in converting the analog image signals.

For hybrid ADCs, the transition between data conversion with the SAR ADC and data conversion with the ramp ADC may be susceptible to a number of non-idealities. In an ideal scenario, the analog magnitude of a least significant bit of the SAR ADC should be equal to a ramp range provided by the ramp ADC. In practice, however, the ramp ADC may include a ramp generator buffer that can potentially suffer from ramp buffer offset and noise that may lead to a mismatch between the ramp ADC range and the least significant bit of the SAR ADC. As another example, ramp generator offset and noise may lead to a signal level at the ramp starting point that fails to match the signal level at the end of the SAR ADC conversion. These non-idealities of hybrid ADC behavior may lead to higher differential nonlinearity (DNL) and missing/repeated codes.

It is generally desirable for image sensors 116 to minimize ADC DNL and to reduce the occurrence of missing/repeated codes in order to avoid artifacts such as fixed pattern noise in the final image data. Similarly, reducing these errors may allow higher speed and power performance for the hybrid ADC. It may therefore be desirable to provide hybrid ADC circuitry that exhibits reduced non-idealities at SAR-to-ramp ADC transitions.

Figure 2:
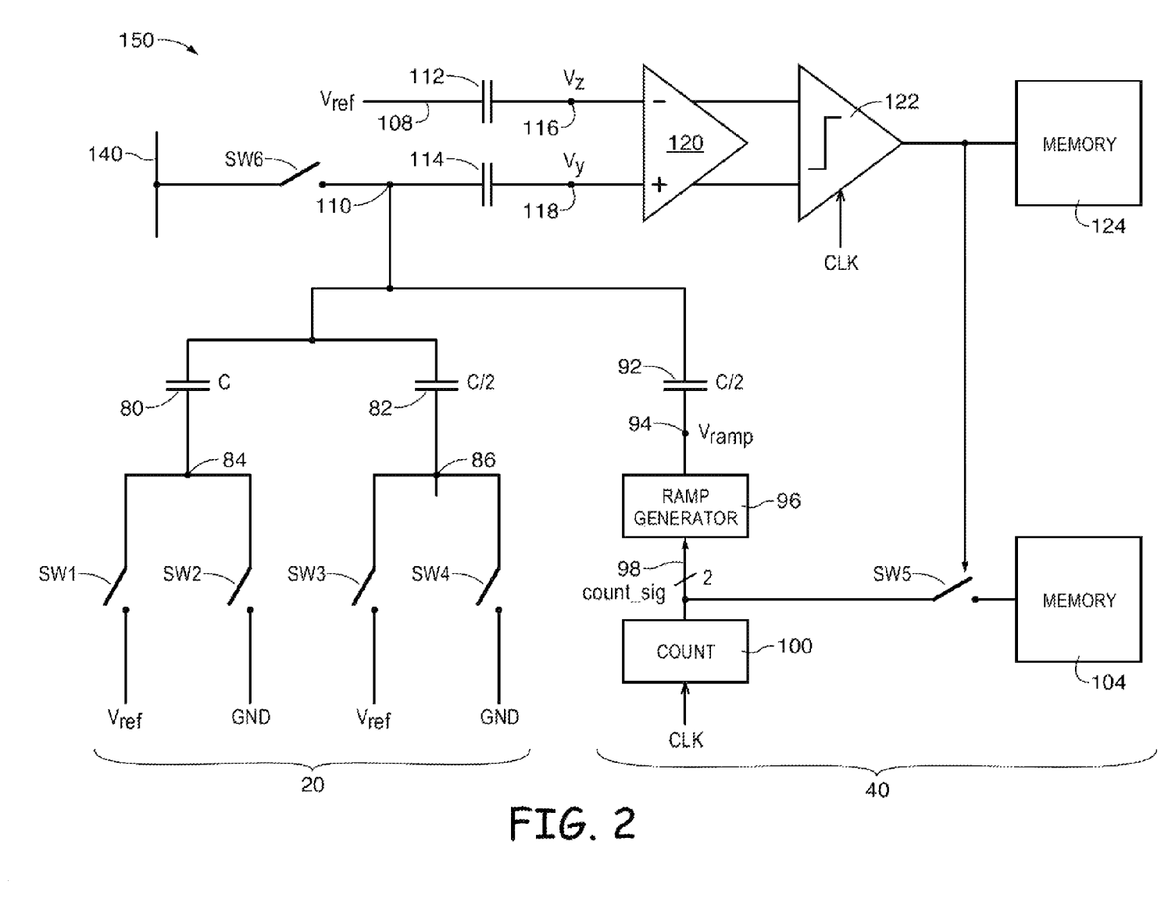
FIG. 2 is a circuit diagram of hybrid successive approximation register (SAR) ramp ADC circuitry in accordance with an embodiment of the present invention.

FIG. 2 shows a circuit diagram that may be used for implementing hybrid SAR and ramp ADC circuitry 150 in accordance with an embodiment of the present invention. As shown in FIG. 2, hybrid ADC circuitry 150 may include SAR ADC circuitry 20 and ramp ADC circuitry 40. SAR data converting circuitry 20 may include at least a first capacitor 80, a second capacitor 82, and switches SW1-SW4. First capacitor 80 may exhibit a first capacitance C, whereas second capacitor 82 may exhibit a second capacitance C/2 (e.g., the second capacitor 82 may exhibit half the capacitance of the first capacitor 80).

Ramp converting circuitry 40 may include third capacitor 92, ramp generator 96, counter circuitry 100, switch SW5, and ramp memory 104. Third capacitor 92 may exhibit a third capacitance C/2 (e.g., the third capacitor 92 may exhibit the same capacitance as second capacitor 82). Hybrid ADC circuitry 150 may further include switch SW6, first coupling capacitor 112, second coupling capacitor 114, amplifier 120, comparator 122, and SAR memory 124. Amplifier 120 and comparator 122 may be considered to be part of the SAR ADC circuitry during the SAR data conversion phase and may also be considered to be part of the ramp ADC circuitry during the ramp data conversion phase.

Column line 140 may be coupled to an intermediate node 110 via switch SW6. Capacitor 80 may be coupled between intermediate node 110 and a first SAR node 84. First SAR node 84 may receive a reference voltage $V_{ref}$ via switch SW1 (when switch SW1 is activated) or may receive a ground power supply voltage GND via switch SW2 (when switch SW2 is activated). Only one of switches SW1 and SW2 can be turned on at any given point in time. Reference voltage $V_{ref}$ may be generated using an on-chip voltage regulator (not shown). Second capacitor 82 may be coupled between intermediate node 110 and a second SAR node 86. Second SAR node 86 may receive reference voltage $V_{ref}$ via switch SW3 (when switch SW3 is activated) or may receive a ground power supply voltage GND via switch SW4 (when switch SW4 is activated). Only one of switches SW3 and SW4 can be turned on at any given point in time.

Third capacitor 92 may be coupled between intermediate node 110 and ramp generator 96. Connected in this way, capacitor 92 may receive ramp voltage $V_{ramp}$ generated at an output 94 of ramp generator 96. Ramp generator 96 may receive count bits count_sig from counter 100 via ramp control line 98. Count bits count_sig may serve to control the rate at which $V_{ramp}$ decrements or increments. Counter 100 may receive clock signals clk that are used to toggle counter output signal count_sig. Control line 98 may be coupled to ramp memory 104 via switch SW5. Ramp memory 104 may receive and store count bits count_sig from counter circuitry 100.

Amplifier 120 may have a positive input, a negative input, and an output (e.g., a differential output). First coupling capacitor 114 may have a first terminal that is coupled to intermediate node 110 and a second terminal 118 that is coupled to the positive input of amplifier 120. An input signal $V_y$ may be provided on node 118. Second coupling capacitor 112 may have a first terminal 108 that receives reference voltage $V_{ref}$ and a second terminal 116 that is coupled to the negative input of amplifier 120. An input-referred reference voltage $V_z$ may be provided on node 116. The output of amplifier 120 may be coupled to the input of comparator 122. Comparator 122 may receive clock signals clk so that the operation of comparator 122, counter 100, and ramp generator 96 are properly synchronized with respect to one another. The output of comparator 122 may be coupled to SAR memory 124. SAR memory 124 may store digital comparison data bits generated at the output of comparator 122.

While performing data conversion with SAR ADC circuitry 20, SAR ADC circuitry 20 may drive node 118 to appropriate voltages $V_y$. Comparator 122 may be configured to output a logic "1" when voltage $V_y$ is greater than voltage $V_z$ and to output a logic "0" when voltage $V_y$ is less than voltage $V_z$. The output of comparator 122 may also be coupled to switch SW5 in ramp circuitry 40. In particular, signals generated at the output of comparator 122 may turn off switch SW5 while performing data conversion with SAR ADC circuitry 20 and may turn on switch SW5 while performing data conversion with ramp circuitry 40.

While performing data conversion with ramp circuitry 40, ramp circuitry 40 may drive node 118 to appropriate voltages $V_y$. Count bits count_sig may be sequentially stored in ramp memory 104 while switch SW5 is turned on. Comparator 122 may be configured to turn off switch SW5 when voltage $V_y$ provided by ramp circuitry 40 become less than voltage $V_z$, preventing further count bits count_sig from being stored in ramp memory 104. Operated in this way, the count bits count_sig that are stored in ramp memory 104 immediately prior to voltage $V_y$ becoming less than $V_z$ may be the final bits stored in ramp memory 104. The bits stored in SAR memory 124 may be combined with the final count bits stored in ramp memory 104 to produce a final digital representation of the analog signal provided by pixels 290 to hybrid ADC 150.

Figure 3:
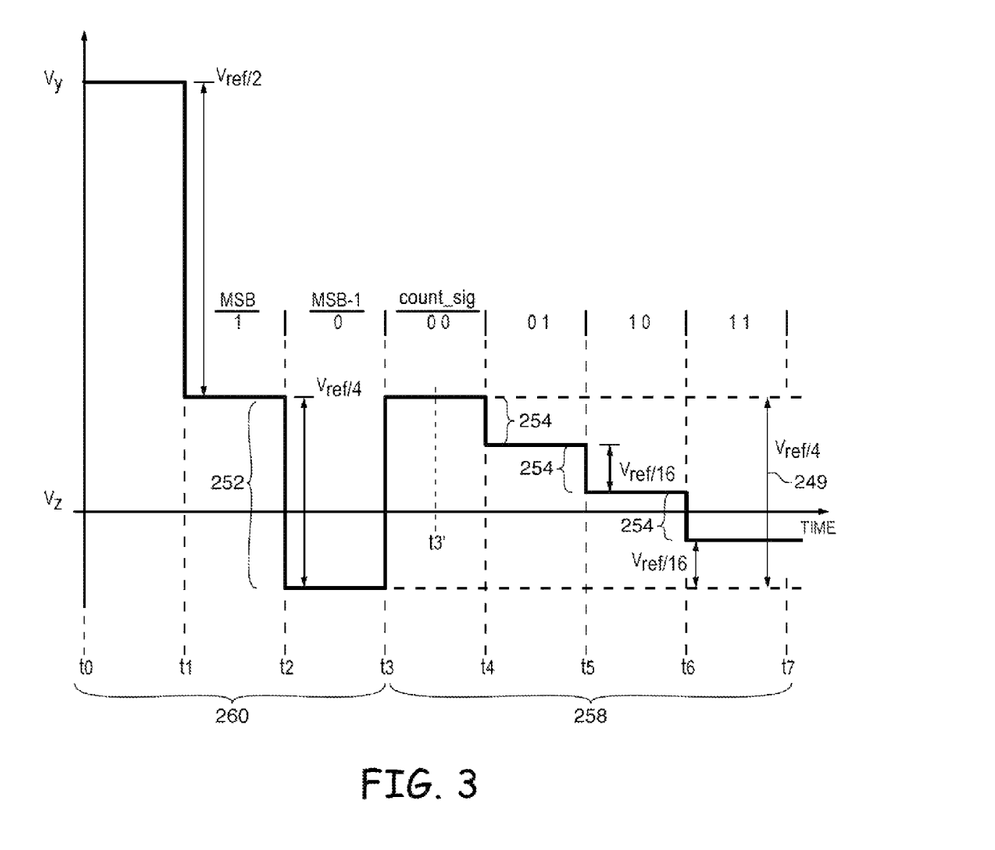
FIG. 3 is a timing diagram illustrating an ideal data conversion process in accordance with an embodiment of the present invention.

FIG. 3 is a timing diagram illustrating proper behavior for signal $V_y$ during operation of hybrid ADC circuitry 150. In the example of FIGS. 2 and 3, two bits are used each by SAR ADC circuitry 20 and ramp circuitry 40 to convert an analog image signal that is supplied to column line 140 by an associated image pixel 290. Between times t0 and t1, switches SW1 and SW3 may be turned on to respectively supply capacitors 80 and 82 with reference voltage $V_{ref}$ (e.g., switch SW2 and SW4 may be turned off during this time).

An initial voltage $V_{y0}$ may be presented on amplifier input node 118 by turning on switch SW6. Voltage $V_{y0}$ should be greater than voltage $V_z$ supplied at amplifier input node 116. At time t1, a most significant bit (MSB) of SAR ADC circuitry 20 may be initialized by shorting first capacitor 80 to ground GND (e.g., by turning off switch SW1 and turning on switch SW2). At this time, voltage $V_y$ on node 118 may drop by $V_{ref}/2$. Between times t1 and t2, comparator 122 may compare input voltage $V_y$ with input voltage $V_z$ to make an MSB decision that $V_y$ is greater than $V_z$. Comparator 122 may subsequently output a logic "1" to be stored as the MSB in SAR memory 124. Alternatively, if $V_y$ is less than $V_z$ after dropping by $V_{ref}/2$ at time t1, comparator 122 may output a logic "0" to be stored as the MSB in SAR memory 124.

At time t2, a second most significant bit (often referred to as MSB-1) may be initialized by shorting second capacitor 82 to ground GND (e.g. by turning off switch SW3 and turning on switch SW4). Voltage $V_y$ may further decrease by $V_{ref}/4$ because second capacitor 82 has a capacitance that is half of the capacitance of first capacitor 80 (e.g., C/2). Alternatively, if $V_y$ is less than $V_z$ after dropping by $V_{ref}/2$ at time t1, voltage $V_y$ may increase by $V_{ref}/4$ at time t2. The time between t0 and t3 may be referred to as SAR data conversion phase 260, in which data conversion is performed by SAR ADC circuitry 20.

The value of the smallest change in $V_y$ during SAR data conversion phase 260 may be referred to as a SAR least significant bit (LSB) 252. Since SAR ADC circuitry 20 uses two bits for data conversion in this example, SAR LSB 252 is equal to $V_{ref}/4$. In the example of FIG. 3, voltage $V_y$ between times t2 and t3 is less than voltage $V_z$. Between times t2 and t3, comparator 122 may compare $V_y$ and $V_z$ to make an MSB-1 decision that $V_y$ is less than $V_z$. Comparator 122 may subsequently output a digital bit "0" to be stored as the MSB-1 in SAR memory 124. Between times t2 and t3, second capacitor 82 may be shorted back to $V_{ref}$ (e.g., by reactivating switch SW3 and deactivating switch SW4). At time t3', SAR ADC circuitry 20 may be temporarily placed in idle mode while ramp ADC circuitry 40 is engaged to perform ramp conversion (e.g., counter 100 may be activated to initiate generation of $V_{ramp}$, thereby turning on switch SW5).

Between times t3 and t7 (sometimes referred to as ramp data conversion phase 258), ramp ADC circuitry 40 may incrementally decrease $V_y$ by ramp least significant bit (often referred to as ramp LSB) 254. The value of $V_y$ before and after each incremental voltage drop during ramp data conversion phase 258 may be referred to as ramp steps. Count bits count_sig may be synchronized with comparator 122 using clock signal clk so that each ramp step corresponds to one configuration of count bits count_sig. Different count bits count_sig may be stored in ramp memory 104 for each ramp step. Count bits count_sig for each ramp step may overwrite the count bits for the previous ramp step in ramp memory 104. The count bits corresponding to the ramp step in which $V_y$ becomes less than $V_z$ represents the last set of count bits that is stored in ramp memory 104. For example, count bits "00" may be stored for a first ramp step between times t3 and t4. At time t4, $V_y$ may decrease by ramp LSB 254. Count bits "01" may be stored for a second ramp step between times t4 and t5. At time t5, $V_y$ may again decrease by ramp LSB 254. Count bits "10" may be stored for a third ramp step between times t5 and t6. At time t6, $V_y$ may finally decrease by ramp LSB 254. Count bits "11" may be stored for a fourth ramp step between times t6 and t7.

Under ideal performance, the value of reference voltage $V_{ref}$ divided by two to the power of the number of bits used for data conversion by SAR ADC circuitry 20 may be referred to as ramp range 249. In the example of FIG. 3 in which ramp ADC circuitry is a two-bit ramp ADC, voltage $V_y$ may have four discrete ramp steps formed from incrementally decreasing $V_y$ by ramp LSB 254 three times. At time t6, voltage $V_y$ may have a value that is one ramp LSB 254 greater than the value of voltage $V_y$ between times t2 and t3 (e.g., ramp LSB 254 may have a value of $V_{ref}/16$ and $V_y$ may be decreased by ramp LSB 254 three times resulting in a ramp range 249 of $V_{ref}/4$). The MSB and MSB-1 stored in SAR memory 124 may be combined with the two count bits count_sig stored in ramp 104 to form a four bit digital representation of the analog signal sampled from column line 140. Ideally, ramp range 249 during ramp data conversion phase 258 is equal to SAR LSB 252 during SAR data conversion phase 260. In practice, however, ramp range 249 may not suitably match SAR LSB 252, which can result in DNL errors and missing codes.

Figure 4:
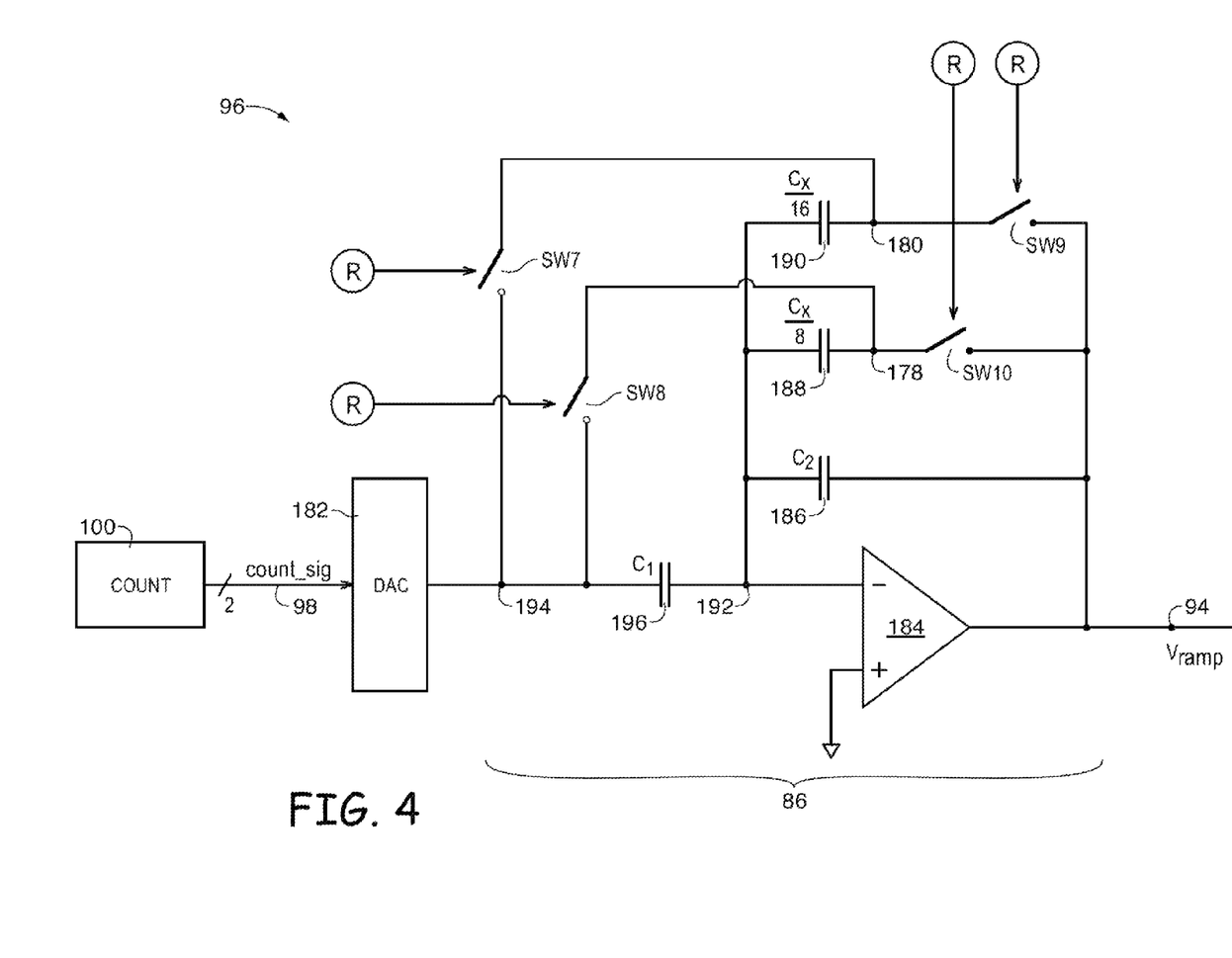
FIG. 4 is a circuit diagram of a ramp generator for use in hybrid SAR-ramp ADC circuitry in accordance with an embodiment of the present invention.

FIG. 4 shows a circuit diagram of ramp generator 96 as shown in FIG. 2 in accordance with an embodiment of the present invention. Ramp generator 96 may include digital-to-analog converter (DAC) circuitry 182 and ramp buffer 86. Ramp buffer 86 may include first ramp capacitor 196, second ramp capacitor 186, third ramp capacitor 188, fourth ramp capacitor 190, switches SW7-SW10, and amplifier 184. Amplifier 184 may have a first (negative) input, a second (positive) input, and an output. First ramp capacitor 196 may exhibit a first ramp capacitance $C_1$, whereas second ramp capacitor 186 may exhibit a second ramp capacitance $C_2$. First ramp capacitor 196 may be connected in parallel with other capacitors to exhibit a first effective capacitance. Second ramp capacitor 186 may also be connected in parallel with other capacitors to exhibit a second effective capacitance. If desired, first ramp capacitance $C_1$ and second ramp capacitance $C_2$ may both be equal to capacitance $C_x$. Third ramp capacitor 188 may exhibit a capacitance $C_x/8$ that is one-eighth of capacitance $C_x$. Fourth ramp capacitor 190 may exhibit a capacitance $C_x/16$ that is one-sixteenth of capacitance $C_x$. Capacitors 186, 188, 190, 196, and switches SW7-SW10 may sometimes be referred to collectively as gain control circuitry for adjusting the gain of amplifier 184.

DAC circuitry 182 may be controlled by count bits count_sig provided by count circuitry 100 via line 98. DAC circuitry 182 may have an output 194 that is coupled to input 192 of amplifier 184 via capacitor 196. Capacitor 196 may have a first terminal that is coupled to DAC output 194 and a second terminal that is coupled to amplifier input 192. Capacitor 186 may have a first terminal that is coupled to amplifier input 192 and a second terminal that is coupled to ramp output 94. Capacitor 188 may have a first terminal that is coupled to amplifier input 192 and a second terminal that is switchably coupled to DAC output 194 via switch SW8 or that is switchably coupled to ramp output 94 via switch SW10. At most one of switches SW8 and SW10 should be turned on at any given point in time. Capacitor 190 may have a first terminal that is coupled to amplifier input 192 and a second terminal that is switchably coupled to DAC output 194 via switch SW7 or that is switchably coupled to ramp output 94 via switch SW9. At most one of switches SW7 and SW9 should be turned on at any given point in time. Switches SW7-SW10 may be controlled by control signals supplied by memory elements R. Ramp signals $V_{ramp}$ may be generated on ramp output 94.

DAC circuitry 182 may generate a ramp voltage that exhibits a voltage range $V_{ref}$ in order to generate a ramp range 249 having a value of $V_{ref}/4$ (since capacitor 92 only contributes one-fourth of the total parallel capacitance at intermediate node 110).

The timing of the ramp voltage output of DAC circuitry 182 may be controlled by count bits count_sig received from counter circuitry 100. When switches SW7-SW10 are turned of, ramp buffer 86 may exhibit an adjustable gain given by the ratio of first and second ramp capacitances $C_1/C_2$. Because capacitance adds for capacitors that are connected in parallel, the gain of ramp buffer 86 may be increased by turning on switches SW7 and SW8. Turning on switches SW7 and SW8 increases the effective capacitance of first ramp capacitor 196 by connecting third ramp capacitor 188 and fourth ramp capacitor 190 in parallel with first ramp capacitor 196. Similarly, the gain of ramp buffer 86 may be decreased by turning on switches SW9 and SW10 to increase the effective capacitance of second ramp capacitor 186.

Increasing the gain of ramp buffer 86 in this way may increase the voltage drop of ramp LSB 254 during ramp data conversion phase 258, leading to a greater ramp range 249. Similarly, decreasing the gain of ramp buffer 86 may decrease the voltage drop of ramp LSB 254 during ramp data conversion phase 258, resulting in a lesser ramp range 249. The gain of ramp buffer 86 may be adjusted in order to match ramp range 249 to SAR LSB 252, or in order to suitably change the size of ramp LSB 254. If desired, only one of capacitors 188 and 190 may be switched into use to increase or decrease gain. Switching in capacitor 188 may adjust gain by a greater amount compared to switching in capacitor 190 since the capacitance of capacitor 188 is greater than the capacitance of capacitor 190. If desired, ramp buffer 86 may include any number of gain adjustment capacitors of varying sizes. Alternatively, ramp buffer 86 may be formed without capacitors such as capacitors 186, 188, 190, and 196.

Figure 5A:
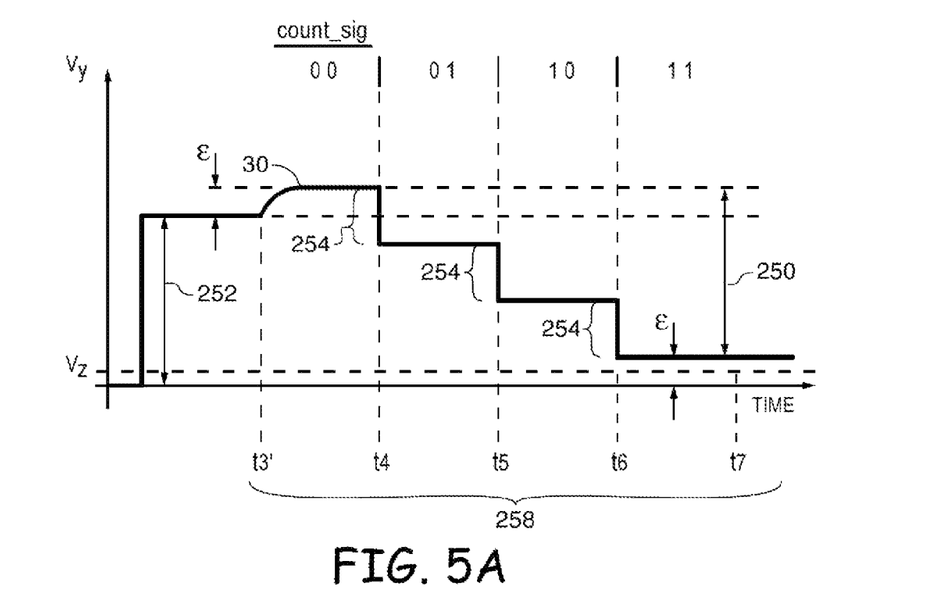
FIGS. 5A and 5B are timing diagrams illustrating a data conversion process having errors that are correctable with the injection of a voltage offset in accordance with an embodiment of the present invention.

The sum of all ramp LSB 254 voltage drops that are performed by ramp ADC circuitry 40 may be referred to as ramp range 250. FIG. 5A illustrates a mismatch that can occur between ramp range 250 and SAR LSB 252 when the value of $V_y$ at the end of SAR data conversion phase 260 is not the same value as at the beginning of ramp data conversion phase 258. Such types of mismatch are often a result of systematic parasitic coupling effects in the form of a glitch. At time t3', voltage $V_y$ increases from SAR LSB 252 by an error voltage $\epsilon$ due to a positive glitch 30. Ramp circuitry 40 decreases voltage $V_y$ by ramp LSB 254 at times t4, t5, and t6. After voltage $V_y$ has decreased by ramp range 250 between times t4 and t6, voltage $V_y$ is $\epsilon$ greater than its target value (i.e., an intended voltage level that $V_y$ would have reached if glitch 30 had not occurred). If error voltage $\epsilon$ is large enough so that $V_y$ is still greater than $V_z$ after time t4, switch SW5 may not be deactivated at the end of the ramp ADC conversion phase. Similarly, if glitch 30 is negative, then voltage $V_y$ will have a value that is $\epsilon$ less than its original target voltage level had glitch 30 not occurred.

Figure 5B:
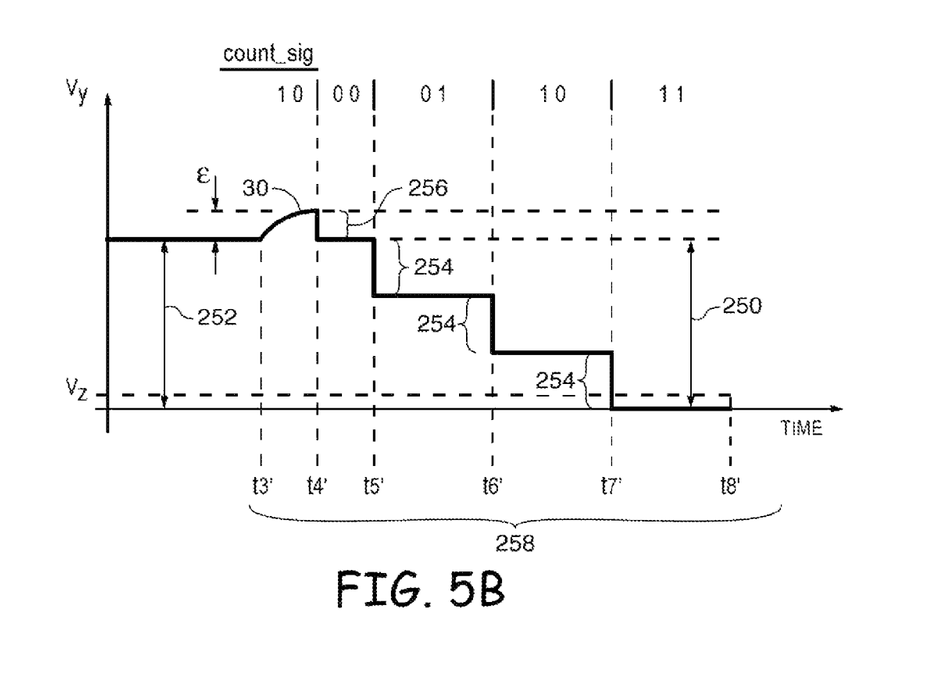

Ramp offsets may be added to voltage $V_y$ to help compensate for the mismatch caused by glitch 30 (see. e.g., FIG. 5B). At time t3', voltage $V_y$ increases from SAR LSB 252 by an error voltage $\epsilon$ due to glitch 30. At time t4', a voltage offset 256 (sometimes referred to as a voltage pedestal) may be injected to $V_y$ to compensate for glitch 30. Pedestal 256 may provide a voltage drop of $\epsilon$. Pedestal 256 may be formed by initializing counter 100 to a non-zero count setting (e.g., so that count_sig is not equal to zero). Counter circuitry 100 may subsequently resume counting from "00."

For example, between times t3' and t4', count bits count_sig may be initialized to "10." Voltage $V_y$ may decrease by voltage pedestal 256 at time t4'. Voltage pedestal 256 may be equal to twice ramp LSB 254. Count circuitry 100 may reset count bits count_sig to "00" to be stored in ramp memory 104 between times t4' and t5'. Voltage $V_y$ may subsequently decrease by ramp LSB 254 at times t5', t6', and t7' until $V_y$ reaches the voltage level it would have reached if glitch 30 had not occurred (e.g., a voltage $V_y$ that is less than $V_z$). In this way, errors formed by the mismatching of $V_y$ at the end of SAR data conversion phase 260 and the beginning of ramp data conversion phase 258 can be reduced. Pedestal 256 may also be formed from a positive voltage offset in order to ensure that voltage $V_y$ begins at a value that is greater than $V_z$ at time t5'. Pedestal 256 may be injected to $V_y$ and the gain of ramp buffer 86 may be adjusted simultaneously.

Figure 6A:
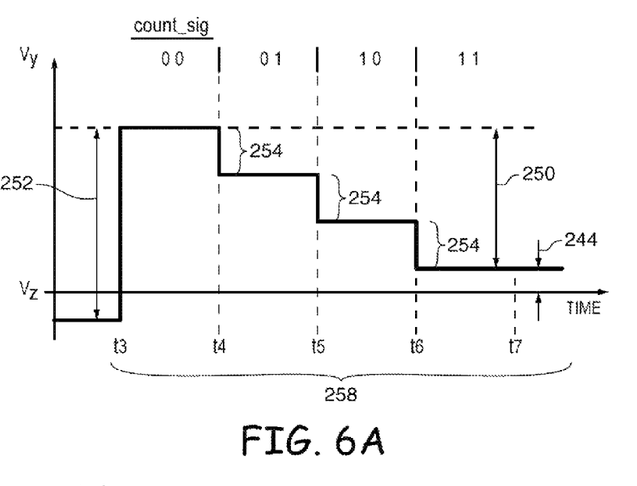
FIGS. 6A and 6B are timing diagrams illustrating another data conversion process having errors that are correctable by extending the voltage range of ramp ADC circuitry in accordance with an embodiment of the present invention.

FIG. 6A illustrates another mismatch that can occur between ramp range 250 and SAR LSB 252 when ramp LSB step sizes 254 are not large enough to bring $V_y$ to a lower voltage than $V_z$. Ramp circuitry 40 decreases voltage $V_y$ by ramp LSB 254 at times t4, t5, and t6. After $V_y$ decreases by ramp range 250 between times t4 and t6, $V_y$ is greater than $V_z$ by voltage margin 244 and ramp range 250 is less than SAR LSB 252. In order to ensure that $V_y$ becomes less than $V_z$ during ramp data conversion phase 258, additional ramp steps may be implemented by adding an additional bit to ramp data conversion phase 258 to effectively extend the ramp range.

Figure 6B:
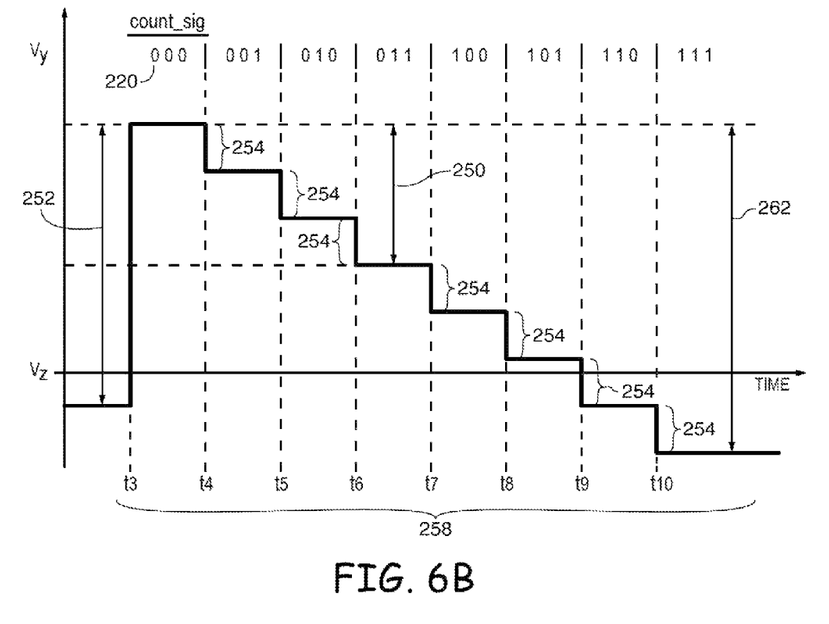

FIG. 6B illustrates the use of an additional ramp ADC bit and an increased ramp buffer gain to allow voltage $V_y$ to drop below voltage $V_z$. At time t3, count circuitry 100 may add error correction bit (ECB) 220 to count bits count_sig. At the same time, ramp memory 104 may be configured to store ECB 220 in addition to count bits count_sig. Adding ECB 220 to count bits count_sig will increase the number of steps in the ramp signal generated by DAC 182. However, increasing the number of ramp steps by adding ECB 220 increases the resolution of ramp ADC 40 without changing ramp range 250. Ramp buffer 86 (FIG. 4) may be configured to simultaneously increase the gain of ramp LSB 254 in order to form an extended ramp range 262 that is greater than ramp range 250. In this way, $V_y$ may be driven below $V_x$ without sacrificing ramp resolution.

In the example of FIG. 6B, a third bit is added as ECB 220 to count bits count_sig. At times t4, t5, t6, t7, t8, t9, and t10, ramp circuitry 40 decreases $V_y$ by ramp LSB 254 to exhibit an extended ramp range 262 that is greater than ramp range 250 associated with the two bit implementation of count bits count_sig. Because $V_t$ becomes less than $V_z$ at time t9 in this example, the count bits "110" will be the final bits stored in ramp memory 104. Configuring ramp circuitry 40 to perform data conversion with ECB 220, increasing the gain of ramp buffer 86, and injecting a ramp offset injection as shown in FIG. 5B may be implemented simultaneously. In this way, voltage $V_y$ may be driven below $V_z$ and voltage $V_y$ may be suitably matched between SAR conversion phase 260 and ramp conversion phase 258. These techniques to improve non-idealities between SAR and ramp data conversion may lead to reduced DNL errors, reduced missing/repeated codes, and reduced comparator delay.

Figure 7:
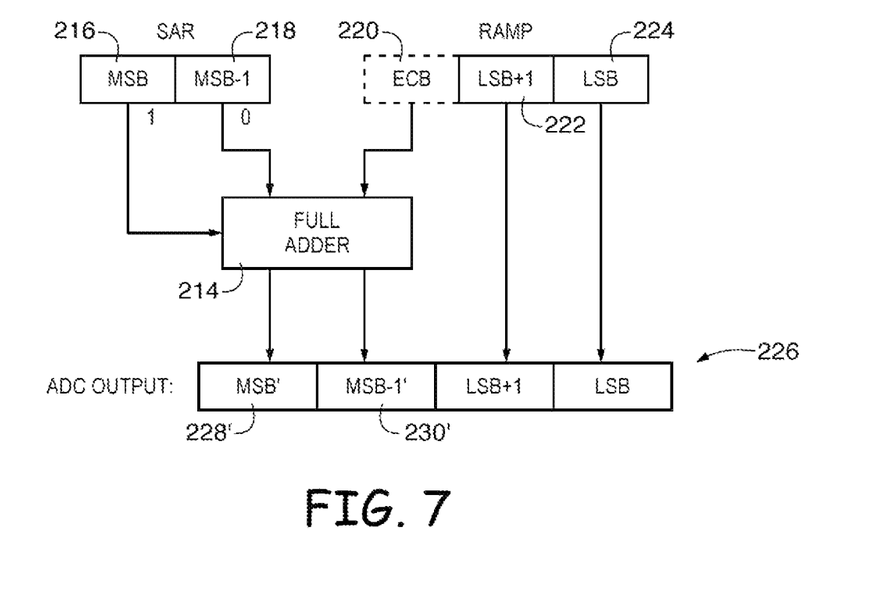
FIG. 7 is a diagram illustrating the use of an error correction bit for correcting errors in a data conversion processes by extending the voltage range of ramp ADC circuitry as shown in FIG. 6B in accordance with an embodiment of the present invention.

FIG. 7 shows a diagram illustrating the construction of output bits of hybrid ADC 150 when adding extra error correction bit (ECB) 220 to count bits count_sig as described in connection with FIG. 6B. During SAR data conversion phase 260, SAR ADC circuitry 20 (FIG. 2) may perform data conversion to produce, for example. MSB 216 and MSB-1 218. During ramp data conversion phase 258, ramp circuitry 40 may perform data conversion to produce, for example, LSB 224 and a second least significant bit (LSB+1) 222. Without adding an additional bit, bits 216, 218, 222, and 224 may be combined (or concatenated in that order) to form a four bit digital representation of the analog image signal received at hybrid ADC 150. ECB 220 may be provided to ramp ADC circuitry 40 to provide an extended ramp range 262 in order to reduce errors between SAR conversion phase 260 and ramp conversion phase 258 (as shown in FIG. 6B).

ECB 220 may be combined with MSB-1 218 and MSB 216 using a full adder 214. Full adder 214 serves to add ECB 220 to MSB 216 and MSB-1 218 to generate a corrected first most significant bit (MSB') 228 and a corrected second most significant bit (MSB-1') 230. For example. MSB 216 may be "1," MSB-1 218 may be "0." and ECB 220 may be "1." Full adder 214 adds MSB 216 and MSB-1 218 with ECB 220 to output an MSB' of "1" and an MSB-1' of "1." Alternatively, if MSB 216 and MSB-1 218 are both logic "1," full adder 214 will not add ECB 220 to MSB 216 and MSB-1 218. MSB' 228 and MSB-1' 230 may be combined with LSB+1 222 and LSB 224 to form ADC output 226. ADC output 226 may be a four bit digital representation of the analog signal provided to hybrid ADC 150.

Figure 8A:
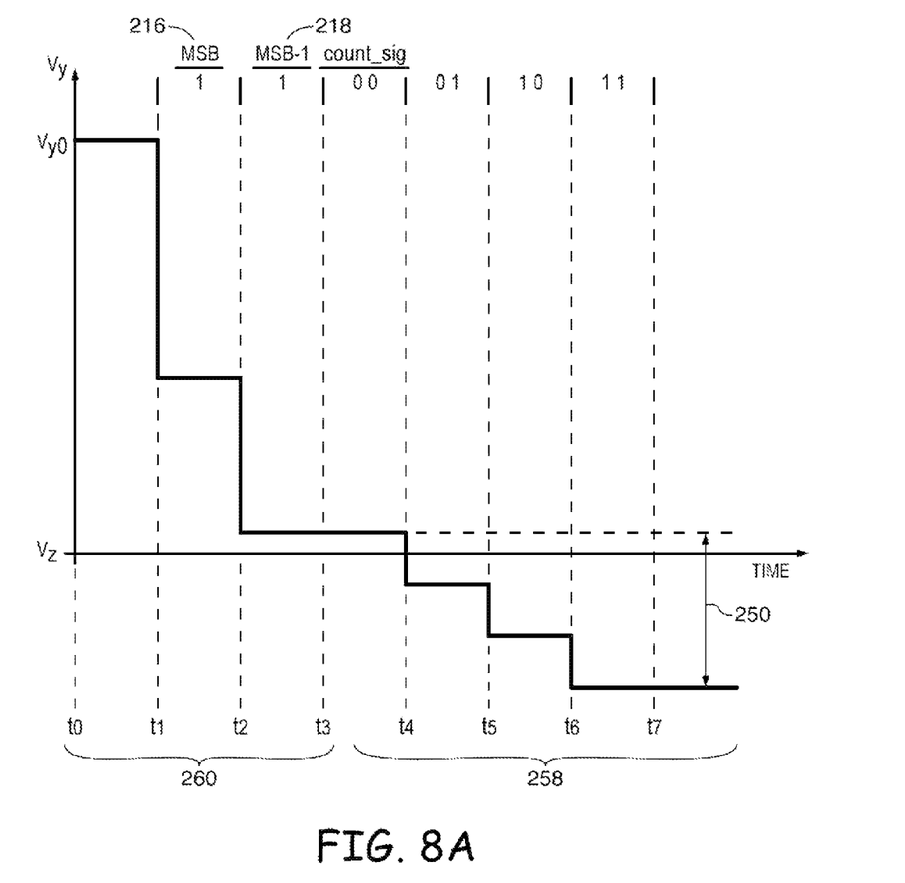
FIGS. 8A-8C are timing diagrams illustrating a data conversion process having errors that are correctable by extending the voltage range of ramp ADC circuitry in accordance with an embodiment of the present invention.
Figure 8B:
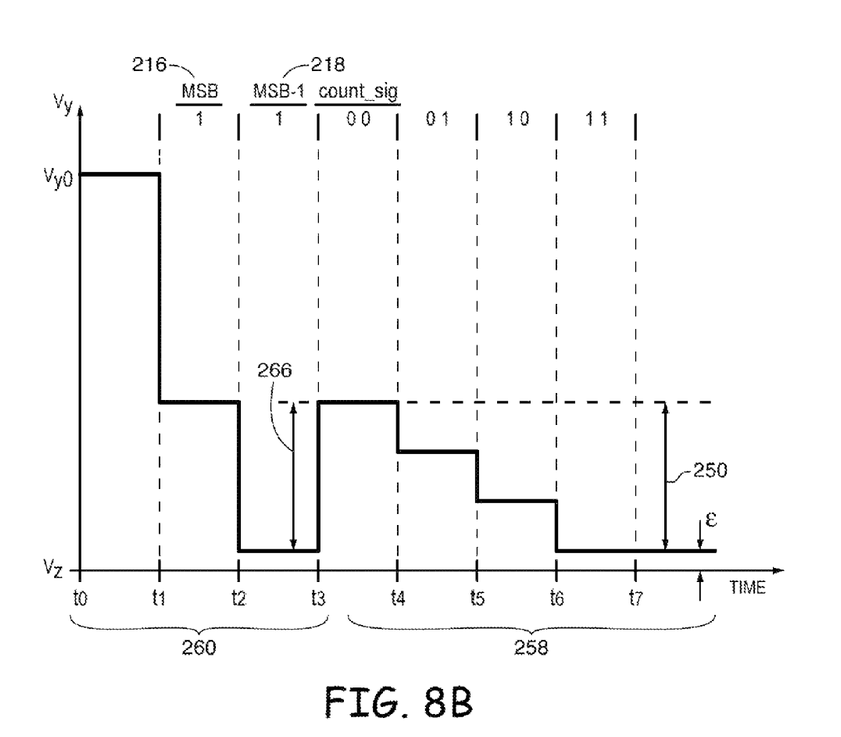

FIGS. 8A-8B show an example of an error that can occur between SAR and ramp data conversion. FIG. 8A is a timing diagram illustrating proper behavior for signal $V_y$ during operation of hybrid ADC circuitry 150. At time t3 after SAR conversion phase 260, voltage $V_y$ is greater than $V_z$, MSB 216 has a value of "1" and MSB-1 218 has a value of "1" stored in SAR memory 124. Between times t3 and t7 (e.g., during ramp conversion phase 258), ramp ADC circuitry 40 decreases $V_y$ by ramp range 250 to a voltage that is less than voltage $V_z$, and accurate digital bits may be stored in ramp memory 104. The final count bits count_sig store a LSB+1 222 value of "0" and an LSB value of "1" in ramp memory 104. ADC output 226 will thereby be "1101" after ramp conversion phase 258 (see FIG. 7). However, errors may occur at time t3 that cause ramp data conversion phase 258 to begin at a voltage that is too large to allow $V_y$ to decrease below $V_z$ during ramp conversion phase 258.

FIG. 8B shows an error that may occur to cause the ADC conversion as illustrated in FIG. 8A to fail. At time t3, a conversion error may occur that causes $V_y$ to increase by voltage error 266. Between times t3 and t7 (e.g. during ramp conversion phase 258), ramp circuitry 40 decreases $V_y$ by ramp range 250 to a voltage that is greater than $V_z$ by a voltage margin E. Inaccurate digital bits are stored in ramp memory 104 because $V_y$ never decreases below voltage $V_z$ during ramp conversion phase 258.

Figure 8C:
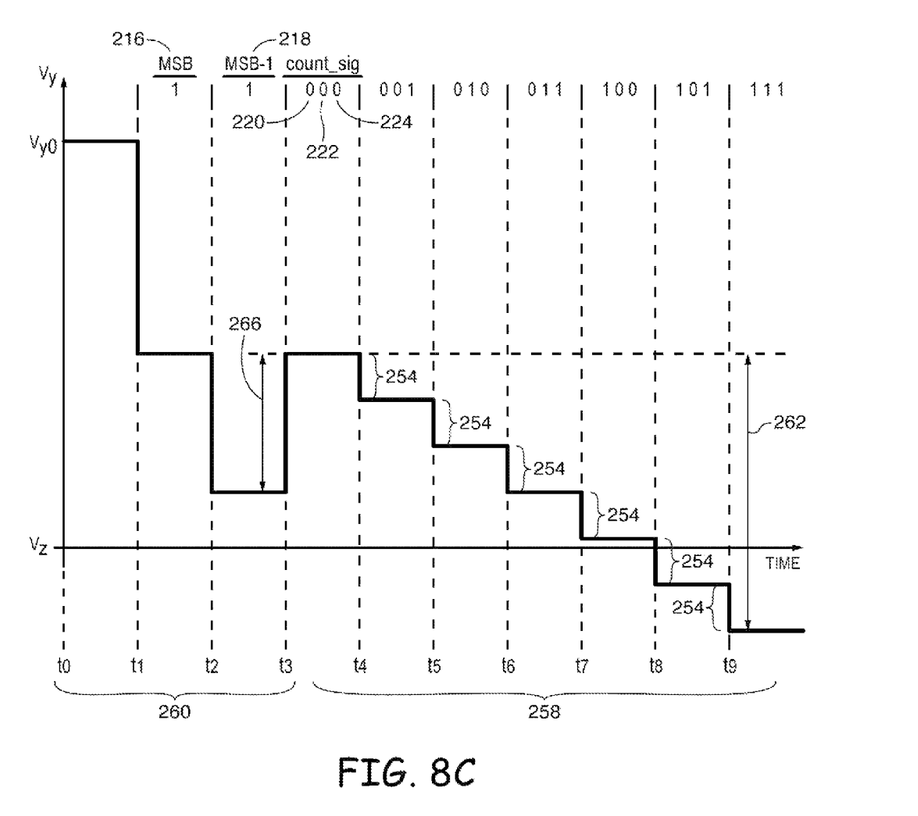

FIG. 8C illustrates adding an additional bit to ramp circuitry 40 in order to correct the error shown in FIG. 8B. After $V_y$ increases by voltage error 266 at time t3, ECB 220 may be added to the count bits count_sig that are received by ramp ADC circuitry 40 as illustrated in FIG. 6B. During ramp conversion phase 258, ramp buffer 86 may be provided with an increased gain to increase the size of ramp LSB 254. At times t4, t5, t6, t7, t8, and t9, ramp ADC circuitry 40 may decrease $V_y$ by ramp LSB 254 to exhibit extended ramp range 262 that is greater than the ramp range 250 associated with the two bit implementation of ramp circuitry 40. Because $V_y$ becomes less than $V_z$ at time t8 in the example of FIG. 8C, an ECB 220 value of "1", an LSB+1 222 value of "0" and an LSB 224 value of "1" are the final count bits count_sig that are stored in ramp memory 104. Since MSB 216 has a value of "1," MSB-1 218 has a value of "1," and ECB 220 has a value of "1" at time t8, full adder 214 will not add ECB 220 to MSB 216 and MSB-1 218. DC output 226 will thereby be "1101" after ramp conversion phase 258, which is the correct ADC output 226 as shown in FIG. 8A.

Configuring ramp circuitry 40 to implement ECB 220, increasing the gain of ramp buffer 86, and injecting a ramp offset injection to reduce errors during the transition between SAR data conversion phase 260 and ramp data conversion phase 258 may be implemented statically or dynamically by image sensor 116. In the static implementation, hybrid ADC 150 in image sensor 116 may be hard-wired to perform matching corrections on each image that is captured. For example, image sensors 116 may be factory calibrated to determine the ramp offsets, gains, and additional bits necessary to reduce conversion errors of hybrid ADC 150. In the dynamic implementation, hybrid ADC 150 in image sensor 116 may be actively calibrated to determine the ramp offsets, gains, and additional bits necessary to reduce conversion errors in hybrid ADC 150 during operation of image sensor 116.

Dynamic calibration may be implemented using software or hardware techniques. For example, image sensor 116 may convert one set of image signals provided by image pixels 290 into a final image. The final image may be analyzed by software to assess the performance of hybrid ADC 150 and to determine the necessary calibration adjustments to account for any errors that occur in the data conversion process. Image sensor 116 may convert another set of image signals provided by image pixels 290 into a final image using the previously determined adjustments in order to prevent any errors from occurring in the subsequent final image.

Hybrid ADC 150 and the associated error correction techniques of FIGS. 1-8 are merely illustrative. If desired, any number of bits may be used by SAR ADC circuitry 20 and ramp circuitry 40 for converting analog signals into digital signals. For example, 10 bits may be used in order to increase the resolution of the digital conversion. Hybrid ADC 150 may include capacitors of any capacitance for storing charge during conversion. Hybrid ADC 150 may include any number of capacitors such as capacitors 80 and 82 to provide suitable resolution of the digital conversion. For example, a greater number of capacitors such as capacitors 80 and 82 may correspond to a higher resolution of digital conversion. Ramp buffer 86 may utilize any number of capacitors that exhibit different capacitances to allow for a wide range of possible gain adjustments to voltage $V_y$. The error correction techniques may be implemented in any number of hybrid SAR and ramp ADCs used in any suitable configuration with image pixel array 400. Adding an additional bit to ramp circuitry 40 may also be implemented in an ADC that utilizes only ramp circuitry to increase the range of ramp performance.

Ramp generator 96 of FIGS. 3-7 is merely illustrative. If desired, ramp generator 96 may be implemented without capacitors such as capacitors 186, 188, 190, and 196 of FIG. 4. Such a capacitor-free ramp generator may perform the error correction techniques of FIGS. 1-8 and may perform gain adjustment using any suitable gain adjustment means. In addition, ramp generator 96 in hybrid ADC 150 may provide a ramp voltage that increments voltage $V_y$ by voltage steps such as ramp LSB 254 (e.g., ramp generator 96 may generate a ramp voltage that increases over time).

Figure 9:
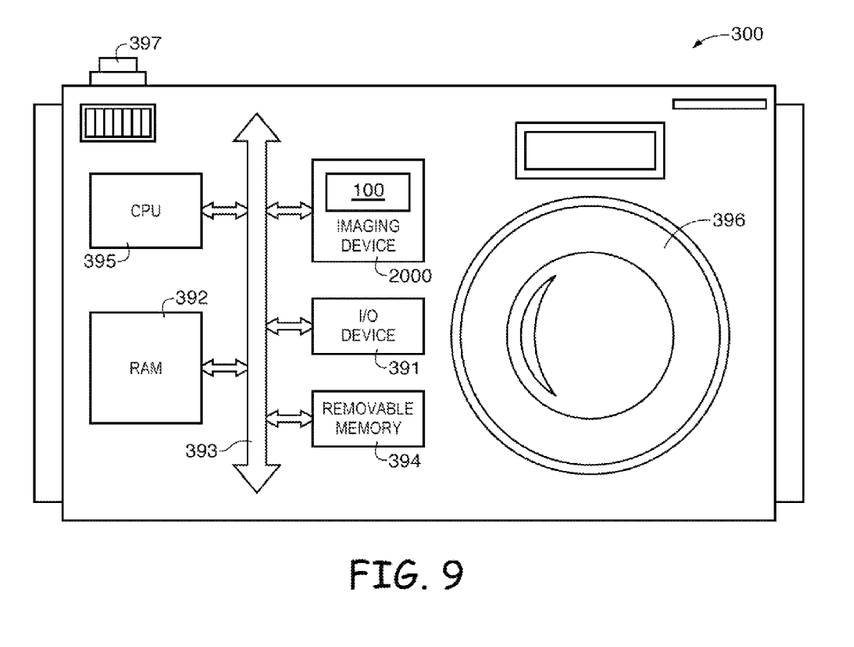
FIG. 9 is a block diagram of a processor system employing the image sensor of FIGS. 1-8 in accordance with an embodiment of the present invention.

FIG. 9 shows in simplified form a typical processor system 300, such as a digital camera, which includes an imaging device 2000 (e.g., an imaging device 2000 such as imaging sensor 116 of FIGS. 1-8 employing a hybrid ADC that implements error correction techniques as described above). The processor system 300 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 300, for example a digital still or video camera system, generally includes a lens 396 for focusing an image on pixel array 100 when a shutter release button 397 is pressed, central processing unit (CPU) 395, such as a microprocessor which controls camera and one or more image flow functions, which communicates with one or more input/output (IO) devices 391 over a bus 393. Imaging device 2000 also communicates with the CPU 395 over bus 393. The system 300 also includes random access memory (RAM) 392 and can include removable memory 394, such as flash memory, which also communicates with CPU 395 over the bus 393. Imaging device 2000 may be combined with the CPU, with or without memory storage on a single integrated circuit or on a different chip. Although bus 393 is illustrated as a single bus, it may be one or more busses or bridges or other communication paths used to interconnect the system components.

Various embodiments have been described illustrating an image sensor that implements code correction for hybrid ADC circuitry. An image sensor may include an image sensor array formed from rows and columns of image sensor pixels. Each column in the image sensor pixel array may be coupled to data conversion circuitry. The image sensor pixels may generate image signals.

The data conversion circuitry may include hybrid data converting circuitry with first and second data converting circuits. The first and second data converting circuits of the hybrid ADC may be successive approximation register (SAR) ADC and ramp-compare ADC circuits, respectively. The hybrid ADC may convert the image signals received from the image sensor pixels into corresponding digital signals. In particular, the SAR ADC may provide data conversion for the image signal to produce a partially converted image signal and the ramp ADC may provide data conversion for the partially converted image signal.

The SAR ADC may perform data conversion during a first phase and the ramp ADC may perform data conversion during a second phase following the first phase. The ramp ADC may output a given number of data conversion bits during the second phase. The ramp ADC may have a nominal output voltage range. The nominal output voltage range may be insufficient for proper data conversion with the ramp ADC. The ramp ADC may include counter circuitry, ramp generator circuitry (e.g. a digital to analog converter that generates a ramp voltage), and comparator circuitry.

The comparator circuitry may compare the ramp voltage to a reference voltage to determine whether the ramp voltage is greater than or less than the reference voltage. The counter circuitry may generate count bits that control the ramp generator circuitry and the comparator. The ramp voltage may decrement as the count bits increment. The count bits may be stored in ramp memory until the ramp voltage is less than the reference voltage. The count bits stored in the ramp memory when the ramp voltage becomes less than the reference voltage may be the least significant bits that represent the image signal.

The ramp ADC may be operable to output an extended output range that is greater than the nominal range by outputting an error correction bit in addition to the given number of data conversion bits. The ramp memory may be switchably coupled to the counter circuitry. The count bits may be stored in ramp memory. The ramp ADC may be controlled using count bits received from the counter circuitry. The SAR ADC may output a given number of most significant data conversion bits. The most significant data conversion bits may be combined with the error correction bit to produce a given number of corrected most significant data conversion bits. The most significant data conversion bits may be combined with the error correction bit using a full adder to add the most significant data conversion bits and the error correction bit.

The count bits received by the ramp memory from the counter circuitry may include count bits with a reset value. The count bits may increment from the reset value count bits during the second phase to have a selected one of a number of count bit values. The ramp generator may decrease the ramp voltage to selected ramp voltages that respectively correspond to each of the selected one of the number of count bit values.

A voltage offset may be injected to the image signal between the first and second phases to compensate for glitches generated as a result of switching between data conversion performed with the SAR ADC and the ramp ADC. The voltage offset may be injected by generating initialized count bits with the counter circuitry that are different from the reset value count bits before beginning the second phase, and generating the reset count bits at the beginning of the second phase.

The hybrid SAR/ramp ADC may be provided in a system that also includes a central processing unit, memory, input-output circuitry, and an imaging device with a lens for focusing light onto image sensor pixels that are coupled to the hybrid ADC. The SAR ADC circuitry in the system may have a first least significant bit range and the ramp ADC circuitry may have a second least significant bit range. The ramp ADC circuitry may also include an amplifier and gain adjustment circuitry coupled to the amplifier. The gain adjustment circuitry may be operable to increase the gain of the amplifier when the second least significant bit range is less than the first least significant bit range and that is operable to decrease the gain of the amplifier when the second least significant bit range is greater than the first least significant bit range. The amplifier may include an input and an output. The gain adjustment circuitry may include a number of capacitors that are switchably connected in parallel between the input and the output of the amplifier. The amplifier gain may be adjusted simultaneously with injecting a voltage offset and outputting an error correction bit. Alternatively, the gain adjustment circuitry may be implemented without capacitors.

The foregoing is merely illustrative of the principles of this invention which can be practiced in other embodiments.

What is claimed is:

1. A method of operating an imaging device having an image sensor pixel, comprising:
generating an image signal with the image sensor pixel;
performing data conversion with a first data converting circuit on the image signal to produce a partially converted image signal; and
performing data conversion on the partially converted image signal with a second data converting circuit operable to output a given number of data conversion bits, wherein the second data converting circuit has a nominal output range when outputting the given number of data conversion bits, and wherein the second data converting circuit is operable to output an extended output range that is greater than the nominal output range by outputting an error correction bit in addition to the given number of data conversion bits.

2. The method defined in claim 1, wherein the first data converting circuit comprises a successive approximation register data converting circuit, and wherein performing data conversion on the image signal to produce the partially converted signal comprises performing data conversion with the successive approximation register data converting circuit on the image signal to produce the partially converted image signal.

3. The method defined in claim 1, wherein the second data converting circuit comprises ramp-compare data converting circuitry, and wherein performing data conversion on the image signal comprises performing data conversion with the ramp-compare data converting circuitry on the image signal to produce the partially converted image signal.

4. The method defined in claim 3, wherein the first data converting circuit has a least significant bit range that is greater than the nominal output range, the method further comprising:

with the ramp-compare data converting circuitry, outputting an extended output range that is greater than the least significant bit range.

5. The method defined in claim 3, wherein the ramp-compare data converting circuitry comprises a comparator, the method further comprising:
with the comparator, receiving a reference voltage and a ramp voltage; and
with the comparator, comparing the ramp voltage to the reference voltage.

6. The method defined in claim 5, wherein the ramp-compare data converting circuitry further comprises counter circuitry and ramp voltage generator circuitry, wherein the ramp voltage generator circuitry is operable to generate the ramp voltage, the method further comprising:
with the counter circuitry, generating count bits that control the ramp voltage generator circuitry and the comparator.

7. The method defined in claim 6, wherein the ramp-compare data converting circuitry further comprises memory, the method further comprising:
storing the count bits in the memory until the ramp voltage is less than the reference voltage.

8. The method defined in claim 1, wherein the first data converting circuit is operable to output a given number of additional data conversion bits, the method further comprising:
combining the additional data conversion bits with the error correction bit to produce corrected data conversion bits.

9. The method defined in claim 8, wherein the second data conversion circuitry further includes a full adder, and wherein combining the additional data conversion bits with the error correction bit comprises:
with the full adder, adding the additional data conversion bits with the error correction bit to produce the corrected data conversion bits.

10. A method of operating an imaging device having an image sensor pixel, the method comprising:
generating an image signal with the image sensor pixel;
during a first phase, performing data conversion with a first data converting circuit on the image signal;
during a second phase following the first phase, performing data conversion with a second data convening circuit on the image signal; and
while transitioning from the first phase to the second phase, switching the first data converting circuit out of use, switching the second data converting circuit into use, and injecting a signal offset on the image signal to compensate for glitches generated as a result switching the first data converting circuit out of use.

11. The method defined in claim 10, wherein the first data converting circuit comprises a successive approximation register data converting circuit, and wherein performing data conversion on the image signal comprises performing data conversion with the successive approximation register data converting circuit on the image signal.

12. The method defined in claim 10, wherein the second data converting circuit comprises ramp-compare data converting circuitry, and wherein performing data conversion on the image signal comprises performing data conversion with the ramp-compare data converting circuitry on the image signal.

13. The method defined in claim 12, wherein the ramp-compare data converting circuitry comprises a ramp voltage generator and a counter, the method further comprising:
with the ramp voltage generator, generating a ramp voltage; and
with the counter, generating count bits that control the ramp voltage generator.

14. The method defined in claim 13, wherein injecting the signal offset on the image signal to compensate for glitches comprises:
before the second phase, initializing the count bits to a given value; and
during transitioning from the first phase to the second phase, resetting the count bits to a reset value that is different than the given value.

15. The method defined in claim 14 further comprising:
with the counter, incrementing the count bits from the reset count bits during the second phase to have a selected one of a plurality of count bit values;
with the ramp voltage generator, decreasing the ramp voltage to a selected ramp voltage corresponding to each of the selected one of the plurality of count bit values.

16. A system, comprising:
a central processing unit;
memory;
input-output circuitry; and
an imaging device, wherein the imaging device comprises:
a pixel array;
a lens that focuses an image on the pixel array; and
an image sensor comprising:
a first data converting circuit that has a first least significant bit range; and
a second data converting circuit that has a second least significant bit range, wherein the second data converting circuit comprises an amplifier having an adjustable gain and associated gain control circuitry, wherein the gain control circuitry is operable to adjust the gain of the amplifier when the first least significant bit range is different than the second least significant bit range.

17. The system defined in claim 16, wherein the gain control circuitry is operable to increase the gain of the amplifier when the second least significant bit range is less than the first least significant bit range and wherein the gain control circuitry is operable to decrease the gain of the amplifier when the second least significant bit range is greater than the first least significant bit range.

18. The system defined in claim 17, wherein the amplifier has an input and an output, wherein the gain adjustment circuitry comprises:
a plurality of capacitors that are switchably connected in parallel between the input and the output of the amplifier.

19. The system defined in claim 18, wherein the second data converting circuitry further comprises:
counter circuitry; and
digital-to-analog converter circuitry having an output, wherein the counter circuitry is operable to provide count bits to the digital-to-analog converter circuitry, and wherein the output of the digital-to-analog converter circuitry is coupled to the input of the amplifier.

20. The system defined in claim 19, further comprising memory that is switchably coupled to the counter circuitry, wherein the memory is operable to store the count bits received from the counter circuitry.

* * * * *